(12) United States Patent
Buard et al.

(10) Patent No.: US 8,378,696 B2
(45) Date of Patent: Feb. 19, 2013

(54) METHOD FOR CHARACTERIZING THE SENSITIVITY OF AN ELECTRONIC COMPONENT TO ENERGETIC INTERACTIONS

(75) Inventors: Nadine Buard, Meudon (FR); Florent Miller, Levallois (FR); Patrick Heins, Castelnau de Montmiral (FR); Thierry Carriere, Triel sur Seine (FR)

(73) Assignee: European Aeronautic Defence and Space Company EADS France, Paris (FR)

( * ) Notice: Subject to any disclaimer, the term of this patent is extended or adjusted under 35 U.S.C. 154(b) by 393 days.

(21) Appl. No.: 12/676,746

(22) PCT Filed: Sep. 5, 2008

(86) PCT No.: PCT/FR2008/051593
§ 371 (c)(1), (2), (4) Date: Aug. 5, 2010

(87) PCT Pub. No.: WO2009/044058
PCT Pub. Date: Apr. 9, 2009

(65) Prior Publication Data
US 2010/0289501 A1    Nov. 18, 2010

(30) Foreign Application Priority Data
Sep. 6, 2007 (FR) .................................. 07 57389

(51) Int. Cl.
*G01R 31/00* (2006.01)
(52) U.S. Cl. ................................... 324/750.01

(58) Field of Classification Search ............. 324/500, 324/501, 750.01, 750.03
See application file for complete search history.

(56) References Cited

U.S. PATENT DOCUMENTS

| | | | |
|---|---|---|---|
| 4,786,865 A | 11/1988 | Arimura et al. | |
| 6,967,491 B2 * | 11/2005 | Perdu et al. | 324/754.23 |
| 7,019,311 B1 | 3/2006 | Horn | |
| 7,173,447 B2 * | 2/2007 | Yamashita et al. | 324/754.23 |
| 7,375,332 B1 * | 5/2008 | Horn | 250/338.4 |
| 7,830,165 B2 * | 11/2010 | Chu et al. | 324/762.02 |
| 2003/0001597 A1 | 1/2003 | Juhn et al. | |

FOREIGN PATENT DOCUMENTS

| | | |
|---|---|---|
| GB | 2069152 | 8/1981 |
| WO | WO 0235249 | 5/2002 |

OTHER PUBLICATIONS

International Search Report dated Jul. 14, 2009.

* cited by examiner

*Primary Examiner* — Jermele M Hollington
*Assistant Examiner* — Feba Pothen
(74) *Attorney, Agent, or Firm* — RatnerPrestia

(57) ABSTRACT

The behavior of a component subjected to pulsed laser radiation is measured. The polarization value, frequency, and temperature (or other operating conditions) to which the component is sensitive are determined by detecting a temporary or permanent fault in the operation of the component. If necessary, the parasitic currents generated are prevented from destroying the tested component at the time of testing. A susceptibility of the component to energetic interactions and the preferred operating conditions for the component are deduced.

12 Claims, 3 Drawing Sheets

METHOD FOR CHARACTERIZING THE SENSITIVITY OF AN ELECTRONIC COMPONENT TO ENERGETIC INTERACTIONS

This application claims priority of PCT International Application No. PCT/FR2008/051593 filed on Sep. 5, 2008. The contents of which are incorporated herein by reference.

FIELD OF THE INVENTION

This invention relates to a method for characterizing the sensitivity to energetic interactions in an electronic component, allowing the component's preferred operating conditions to be determined.

BACKGROUND

The operation of electronic components can be disrupted by the environment in which they operate, ex. an artificial or natural radiation environment or an electromagnetic environment. Harmful external factors trigger the creation of parasitic currents by interacting with the material that makes up the component. These may cause the temporary or permanent malfunction of the component and the application that uses it.

In a natural radiation environment, these effects, generally called singular effects, are created by particles. For example, heavy ions and protons in space affect the electronic equipment in satellites and launch vehicles. At the lower altitudes where airplanes operate, there is an especially high presence of neutrons, which also create singular effects. On the ground, such harmful factors can also be found and can affect electronic components, whether due to particles in the natural environment, radioactive particles in the boxes, or the immunity, signal integrity, thermal instability, or method. In the rest of the text, the effects of particles will be addressed more specifically, but the invention remains applicable to the same types of effects created by various diverse environments.

The physical phenomena responsible for failures caused by harmful external factors are rather varied. It is possible, however, to identify several major categories of failures. The invention applies particularly to some of the effects caused by the radioactive or electromagnetic environments that are produced by the combined action of creating parasitic currents and amplifying or maintaining these parasitic currents.

For example, a global or localized triggering of a parasitic thyristor, called a latchup or Single Event Latchup (SEL), in a part of the component (then called a microlatchup), a triggering of a parasitic bipolar transistor, called snapback or SES, a failure involving the combined action of triggering a parasitic bipolar structure and the amplification or maintenance of the parasitic current, called Single Event Burnout (SEB). These effects may or may not be destructive to the component.

More specifically, the interaction of a particle or radiation with the material may result in the creation of electron charges or holes. Under certain conditions, these charges can trigger one or more parasitic structures. These structures are called parasitic because, although they exist in the component intrinsically, they are never activated when the component is operating normally.

The conditions that produce these triggers are mainly related to the amount of charge generated, the location, and the type (spatial and temporal) for the generated charge.

However, most of the time, the triggering of these parasitic structures, resulting from the generation of charges, is not enough to cause the component to fail. A second phenomenon can maintain or amplify the parasitic current generated by the first phenomenon. The triggering of this second phenomenon is primarily linked to the component's intrinsic characteristics (doping level, physical organization of the component, etc.) and operation conditions, particularly its polarization, frequency, temperature.

For example, an SEB phenomenon can be triggered in power components. These include, for example, MOS power field-effect transistors MOSFET, insulated gate bipolar transistors IGBT, power diodes, and others. For example, FIG. 1 shows, for such a polarized (positive drain-force voltage) n-type silicon technology MOSFET power transistor that is initially blocked and has a parasitic bipolar structure, that the (direct or indirect) action of a particle from the natural radiation environment with the silicon that makes up the transistor results in the creation of a number of electron-hole pairs in the component. Under the influence of electrical fields and diffusion, these charges move, which generates a parasitic current within the structure. Under certain conditions, particularly where the charges are generated and the amount of charge generated, the parasitic current can pass directly through an originally blocked source/caisson junction. To the extent that the source/caisson junction can be passed through and although the caisson/drain junction is polarized in reverse, a source/caisson/drain parasitic bipolar transistor is triggered. The source is a transmitter, the caisson is the base, and the drain is the collector. In the absence of amplification and maintenance phenomenon, this parasitic structure remains able to be passed through while the charges generated by the particle/silicon interaction are drained. It is then blocked again, and the component returns to its normal operation. However, depending on certain parameters, particularly the polarization voltage applied to the drain, the temperature, and the internal technology of the component, the conditions may be satisfied so that local impact ionization occurs initially at the caisson-drain junction (highly polarized in reverse) and allows the amplification and maintenance of the parasitic current in the source-caisson-drain parasitic bipolar structure. Generally in the absence of protection, the amplification of the parasitic current causes the destruction of the component.

This example shows that the SEB phenomenon is indeed triggered by the combined action of both phenomena: the triggering of a parasitic structure and the amplification/maintenance of the parasitic current.

The physical nature of the initial parasitic current's amplification and/or maintenance phenomena varies according to the type of radiation effects and the type of components. In the case of the SEB phenomenon, it is an amplification/maintenance of the current due to the impact ionization. In the case of the SEL phenomenon, for CMOS technologies, the current amplification/maintenance happens by the triggering of a parasitic bipolar structure combined with the first, and the results may be temporary, permanent, or destructive.

Currently, there is no way to measure polarization voltage or any other characteristics of use, frequency, temperature, pressure, magnetic field value, or other factors, below which a component may no longer be subject to triggering such parasites.

SUMMARY OF THE INVENTION

The purpose of the invention is to overcome this problem by proposing the use of a system based on a laser, preferably pulsed, to indicate whether an electronic component is intrinsically sensitive to failures involving the phenomena of creating parasitic currents, amplification, and/or maintenance, and to identify and measure the sensitivity of the component to these same effects when the conditions for using the component change. In this sense, the invention can define proper conditions of use. These proper conditions of use, if they are followed, minimize the likelihood of such failures appearing in the event of energetic interactions, specifically those due to the natural radiation environment.

If these properties are well chosen, a laser, like particles, can locally and temporarily ionize the semiconductor in electronic component, thus causing parasitic currents. For this, the laser must have a wavelength that allows charges to be generated (by linear or nonlinear absorption) in the material that makes up the component. For example, for linear absorption in silicon, the laser's wavelength must be less than 1.1 µm (the energy of the laser photon from the laser source is greater than the value of the semiconductor's band gap). The laser is used preferably as a single pulse or synchronized with a signal from the component being tested. An optical system is used to focus the laser beam on the component's active areas. Finally, on the optical path of the laser beam, there is a system for modifying the laser's energy. This system has an interface to allow it to be controlled from a computer.

A system of motors allows the laser beam to move with relation to the electronic component along three axes.

The casing for the electronic component being tested is preferably open on one of its two sides in order to allow a laser beam to excite the sensitive areas. Preferably, this opening is on the back side of the component.

The tested component is placed in an environment that recreates its use conditions, particularly its operating frequency, its polarization, and its temperature, and the component performs the function it has been assigned, if applicable. A test system can detect a failure and, if necessary, defuse it to avoid the total loss of the component's functionality. The invention therefore relates to a method for characterizing the sensitivity to energetic interactions in an electronic component in which, the electronic component is turned on,
the electronic component is excited and thus turned on using laser radiation,
an operational failure is detected in the electronic component, corresponding to a value of excitation, characterized in that
the component's use conditions change, namely its polarization and/or input signal and/or command signal and/or frequency and/or temperature and/or output charge
the changed use conditions are measured, which may or may not reveal such a triggering phenomenon.

BRIEF DESCRIPTION OF THE DRAWINGS

The invention will be better understood upon reading the following description and studying the figures that accompany it. They are presented for illustrative purposes only and are not limiting to the invention. The figures show.

DETAILED DESCRIPTION

Figure 1:
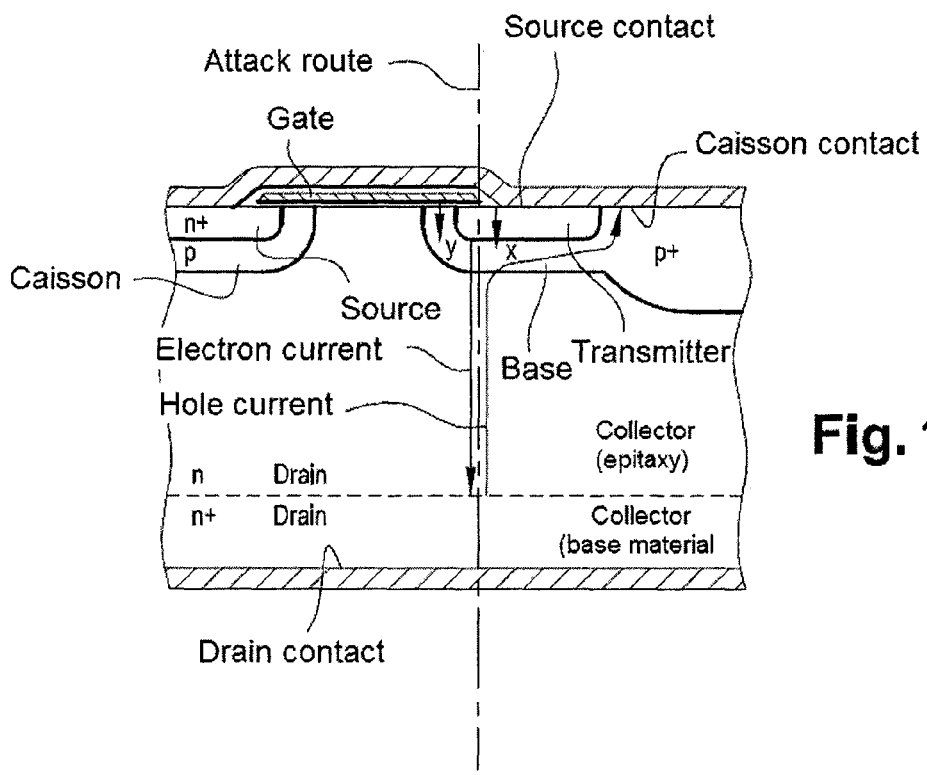
FIG. 1: Already commented, an SEB phenomenon triggered in power components.
Figure 2:
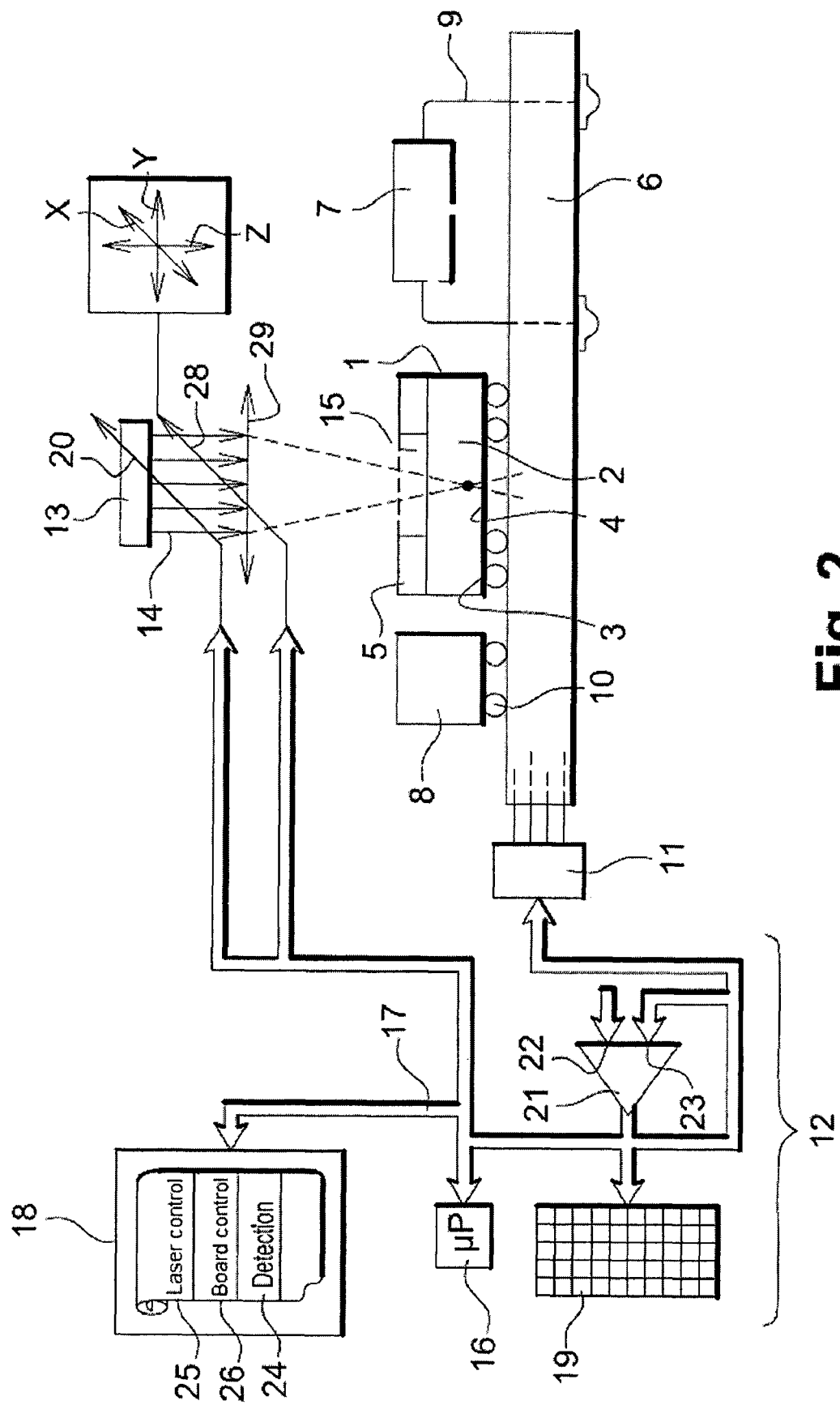
FIG. 2: A device that can be used to implement the method according to the invention.

FIG. 2 shows a device that can be used to implement the method according to the invention; The goal of the invention is to measure the effects of energetic interactions in an electronic component 1, such as the type shown in FIG. 1. The electronic component 1 thus has, in a known matter and presented in reverse, a semiconductor crystal 2 in which the following appear in various locations: caissons, areas established by impurities, or even epitaxial areas. Connections, which are typically metallic, such as 3, lead to an interface 4 connected to the electronic component 1. There may sometimes be a support and/or protection 5 located on the upper and/or lower faces of the crystal 2.

In the invention, in order to measure the operating failures of an electronic component 1 that will be subject to energetic interactions, the component 1 will be mounted on a test electronic board 6, such as a printed, single-layer, or multilayer circuit board. The board 6 may be used for other components such as 7 and 8, with connecting pins 9 passing through the board 6, or with solder balls, as in 10, for components mounted to the surface. These other components can be used to modify the operating conditions of the component 1. For example, the component 7 can be a thermostated heating resistor for bring the component 1 to a desired temperature. For example, the component 8 can be a clock to control the component 1 with a desired frequency. The other components can also be used to protect component 1.

The board 6 has a connector 11 to be connected to a testing device 12 to measure the sensitivity of the component 1 to energetic particles. With this device 12, the component 1 is excited by means of a laser source 13. This laser source 13 emits radiation 14 that attacks the electronic component 1. To support this attack, the component 1 is preferably submitted to this attack by its base 5. To support this attack, the support and/or protection 5 is preferably open (particularly through a chemical or mechanical process) in a window 15, through which the radiation 14 of the laser 13 can penetrate. In one example, the laser source causes a simultaneous absorption of several photons in a semiconductor material.

At the time of testing, the electronic component 1 is connected by its interface 11 to the device 12 that can provider power and control. The device 12 comprises, schematically, a microprocessor 16 connected by a control, address, and data bus 17 to a program memory 18, data memory 19, interface 11, the laser source 13, and a laser energy attenuation system 20. The device 12 also comprises, as shown schematically, a comparator 21 receiving expected electricity on a set input 22 and electrical signals collected by the interface 11 on a custom output 23 in the component 1, while the component undergoes interactions and laser excitations 13.

The comparator 21 may be replaced by a custom subprogram 24 for the signal received from the electronic component 1. The measurement operation may be static. In that case, only the potential values and available currents are tested on the interface 11 plots. It can be dynamic. The microprocessor 16 also comprises a clock that counts certain operations that must be logged, such as the growth or decrease in laser energy. The response is measured so as to determined whether it meets expectations or presents anomalies.

To this end, the program memory 18 comprises a control program 25 for the laser source 13, its XYZ movements with relation to the component 1, and its power. The memory 18 preferably finally comprises a program 26 for changing the operating mode of the component 1. Such changes include the clock 8, the input and/or control signals, the output charge, the polarization voltage of the component 1 available also on the bus 17 and interface 11, and the temperature caused, for example, by the radiator 7. If other operating conditions are planned, the board 6 can include the components, particularly the magnetic components required. These other components are also controlled by the microprocessor 16.

Figure 3:
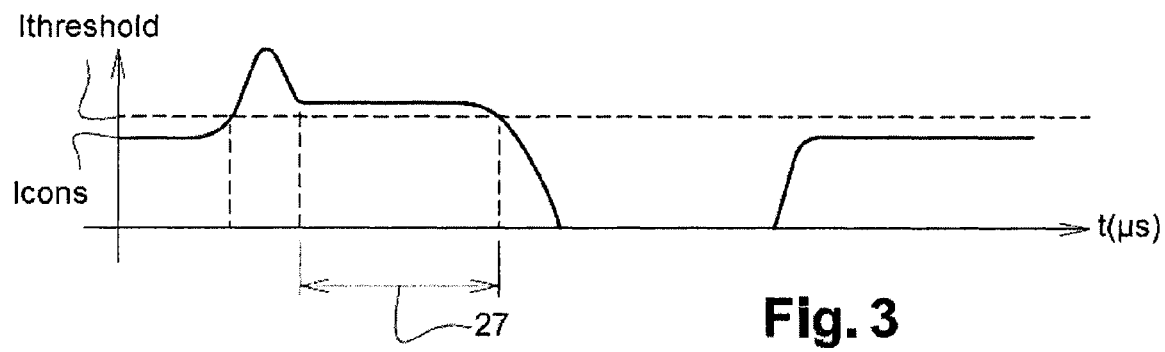
FIG. 3: The description of a system for identifying and defusing an SEL phenomenon.

In the example in FIG. 3, the testing system monitors the current consumption Icons of the component 1. When an overconsumption is detected, whereby Icons is greater than a threshold (threshold, the current is reduced, in order to avoid destroying the component, and maintained for a certain time 27, in order to ensure that it is truly an SEL phenomenon. Then the power is cut, and the component 1 is turned on. The SEL phenomenon was thus detected and then defused so as not to destroy the component 1.

Figure 4:
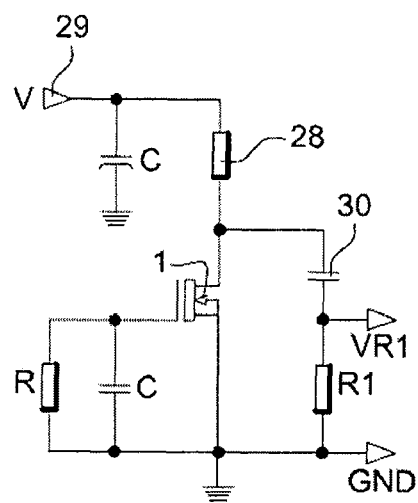
FIG. 4: The description of a system for identifying and defusing an SEB phenomenon.

In one example, the board 6 is equipped with the components shown in the diagram in FIG. 4. With the same goal of protection, a resistor 28, placed along the power supply 29 for the component 1 can limit the delivered current. When an SEB phenomenon is triggered, a transistor from the component 1 temporarily allows a current to flow. Because the current cannot be provided by the power supply 29 (due to the resistor 28), a parallel capacity 30 on the component 1 is discharged. This discharge produces the duration 27. When the capacity 30 is fully discharged, the current needed to maintain the failure is no longer supplied. The component 1 then returns to normal. The failure has been defused. This system can therefore detect a failure by measuring, such as with an oscilloscope, the capacity discharge and also prevent the failure from becoming destructive.

The shots from the laser may or may not be synchronized with a signal from the component being tested, and for each show, a check is carried out on the test system to see whether one or more failures have occurred.

For an X/Y position of interest, the focus of the laser beam is adjusted to identify the position at which the component demonstrates a maximum sensitivity to a laser pulse. This maximum sensitivity occurs when the laser energy needed to cause a failure is minimal. This operation is carried out for a position of interest and given use conditions, but it may also be systematically repeated at all positions for which the laser is mapped. In addition, an optimal focus at a depth Z is determined, or a three-dimensional sensitivity mapping is carried out.

The positions and shots from the laser may be chosen at random to possibly reproduce the impact of particles from the natural radiation environment, or they may be carefully adjusted in order to location the spatial and temporal positions at which the component fails.

Then, for the different positions and for a laser energy greater than this minimum energy, one of the parameters in the component's use conditions is adjusted so as to detect the threshold for the parameter, beyond which triggers a failure. For this use condition, the preferred operating domain for the component with respect to energetic interactions is thus determined.

A spatial mapping of the component's sensitivity can thus be made based on the component's use conditions and on the laser energy.

Figure 5:
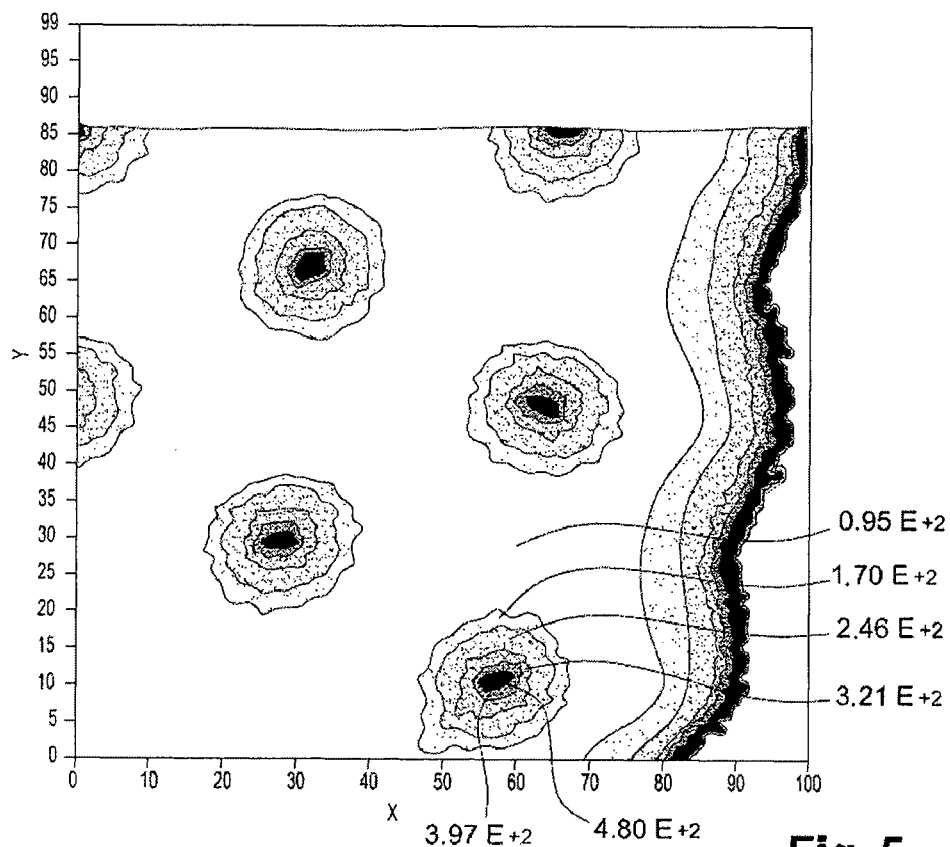
FIG. 5: A mapping of an MOS power transistor's sensitivity to the SEB based on the drain/source polarization voltage.

In this respect, FIG. 5 shows an example of the influence of the drain/source polarization voltage on the triggering of an SEB phenomenon in a power component. It shows that, if the polarization voltage is less than 95 volts (0.95 E+2), the component 1 resists attacks in every respect. The SEB phenomenon does not occur. It also reveals that, by highly specific locations in a few visible spots, the laser attack produces an SEB phenomenon only if the polarization voltage is greater than 480 volts.

Figure 6:
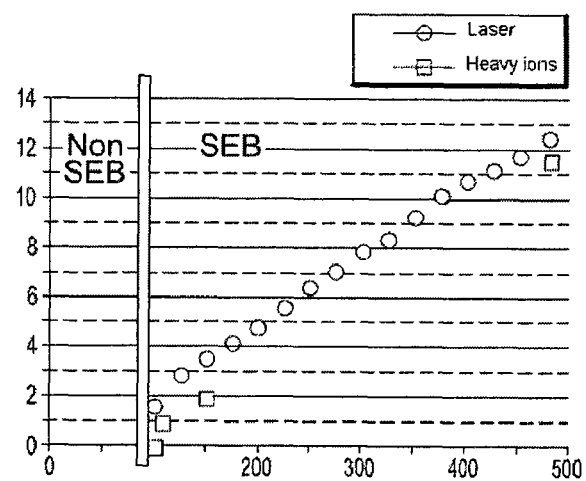
FIG. 6: Change in the maximum current amplitude for a given laser energy, based on the drain/source polarization voltage.

The curve in FIG. 6 can be extracted for a position of the mapping in FIG. 5. For example, it shows the change in the maximum current amplitude for a given laser energy, based on the drain/source polarization voltage. Two areas are identified. Beyond 95 volts, the component is sensitive to failure. Below 95 volts, failure occurs at that position. It also shows the justification for the laser approximation by comparing the laser attacked (the curve with the small dots) and the attack on heavy ions (the curve with the small squares), giving the same result in terms of the threshold beyond which an SEB phenomenon may be produced, thus validating the method with respect to the considered environment.

The invention claimed is:

1. A method for characterizing the sensitivity to energetic interactions in an electronic component comprising:
   turning on the electronic component,
   exciting the electronic component with a laser radiation,
   detecting an operational failure in the electronic component, corresponding to a value of excitation,
   changing the component's use conditions including at least one of a polarization of the component's electrical contacts, input signal, command signal, frequency temperature or output charge;
   measuring the changed use conditions to reveal if a failed operation is due to a triggering phenomenon.

2. A method according to claim 1, wherein
   a limit of the thus changed condition represents a limiting condition for energetic interactions.

3. A method according to claim 1, wherein
   the triggering phenomena studies are single event burnout (SEB), single event latchup (SEL), microlatchup, snapback (SES), or any other phenomena involving a parasitic bipolar structure combined with a current amplification and/or maintenance mechanism.

4. A method according to claim 1, further including:
   opening a window in a support or protector for a base of the component, and
   exciting the component by a face of its base.

5. A method according to claim 1, further including:
   focusing the laser radiation at various depths in the component.

6. A method according to claim 1, further including:
   protecting the component during the excitation,
   including setting up a protective circuit in a polarization circuit on the component.

7. A method according to claim 1, further including:
   establishing a map with locations of interest in the component where the triggering phenomena are strongest.

8. A method according to claim 1, further including:
   varying the power of the laser by steps.

9. A method according to claim 1, wherein
   an energy of a laser photon from the laser source is greater than a value of the semiconductor component's band gap.

10. A method according to claim 1, further including:
    for a position of interest, adjusting a focus of the laser beam to a minimum energy value in order to identify a position at which the component demonstrates a maximum sensitivity to a laser pulse,
    for a laser energy greater than the minimum energy, modifying one of the parameters in the component's use conditions so as to detect a threshold for the parameter, beyond which triggers a failure.

11. A method according to claim 1, wherein a laser source causes a simultaneous absorption of several photons in a semiconductor material.

12. A device for A device for characterizing the sensitivity to energetic interactions in an electronic component, comprising:

- a means for turning on the electronic component
- a means for exciting the electronic component with a laser radiation
- a means for detecting an operational failure in the electronic component, corresponding to a value of excitation,
- a means for changing the components use conditions including at least one of a polarization of the component's electrical contacts, input signal, command signal, frequency, temperature, output charge;
- a means for measuring the changed use conditions to reveal if a failed operation is due to a triggering phenomenon.

* * * * *

UNITED STATES PATENT AND TRADEMARK OFFICE
CERTIFICATE OF CORRECTION

PATENT NO.       : 8,378,696 B2                                            Page 1 of 1
APPLICATION NO.  : 12/676746
DATED            : February 19, 2013
INVENTOR(S)      : Buard et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 543 days.

Signed and Sealed this

First Day of September, 2015

Michelle K. Lee
*Director of the United States Patent and Trademark Office*